United States Patent [19]

Shen et al.

[11] Patent Number: 5,142,401
[45] Date of Patent: Aug. 25, 1992

[54] APPARATUS AND METHOD FOR A LINEAR, WIDEBAND SENSITIVE OPTICAL RECEIVER

[75] Inventors: Nelson M. Shen, Palo Alto; Vinh P. Le, Sunnyvale, both of Calif.

[73] Assignee: Raynet Corporation, Menlo Park, Calif.

[21] Appl. No.: 545,251

[22] Filed: Jun. 28, 1990

[51] Int. Cl.[5] .......................................... H04B 10/06
[52] U.S. Cl. .............................. 359/189; 250/214 A; 330/59
[58] Field of Search ...................... 455/619, 617, 606; 330/59, 308; 250/214 A, 214 R; 359/189

[56] References Cited

U.S. PATENT DOCUMENTS

| | | | |
|---|---|---|---|
| 4,563,656 | 1/1986 | Baum | 330/59 |
| 4,723,313 | 2/1988 | Folcke et al. | 455/619 |
| 4,856,095 | 8/1989 | Rauscher | 455/619 |
| 4,959,535 | 9/1990 | Garrett | 250/214 A |
| 4,998,012 | 3/1991 | Kruse | 455/619 |

FOREIGN PATENT DOCUMENTS 54-34791  3/1979  Japan.
63-136836  9/1988  Japan.

Primary Examiner—Reinhard J. Eisenzopf
Assistant Examiner—Kinfe-Michael Negash
Attorney, Agent, or Firm—Dennis E. Kovach

[57] ABSTRACT

An optical receiver includes a photodetecting device and a wide band video amplifier. The photodetecting device and the video amplifier are coupled by reactive elements which are selected to provide a highly linear and highly sensitive response over a frequency range of approximately 400-950 MHz. The crosstalk between two signals are ten parts per billion when the laser power is at 1 milliwatt and modulation is 25 percent per signal. The noise generated by the receiver is only equivalent to 6 billionth of an ampere. The receiver uses commerically available components.

7 Claims, 4 Drawing Sheets

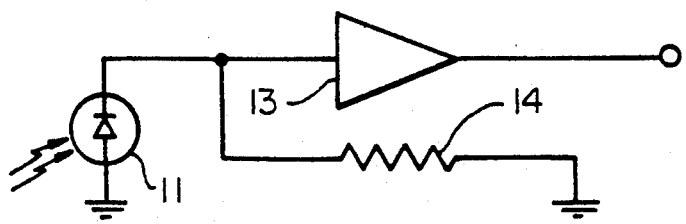
FIG_1a
(PRIOR ART)
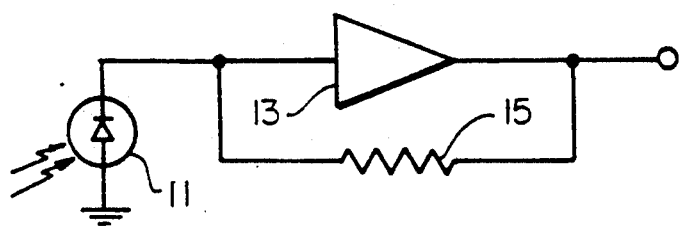
FIG_1b
(PRIOR ART)
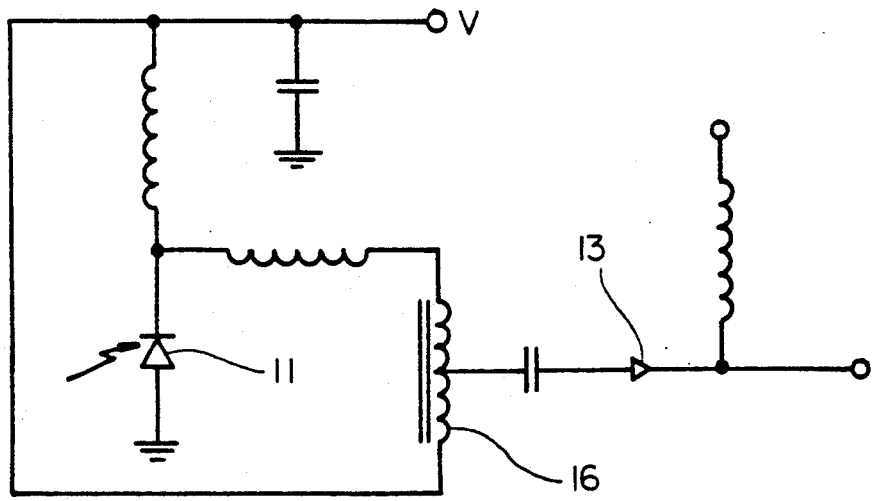
FIG_1c
(PRIOR ART)

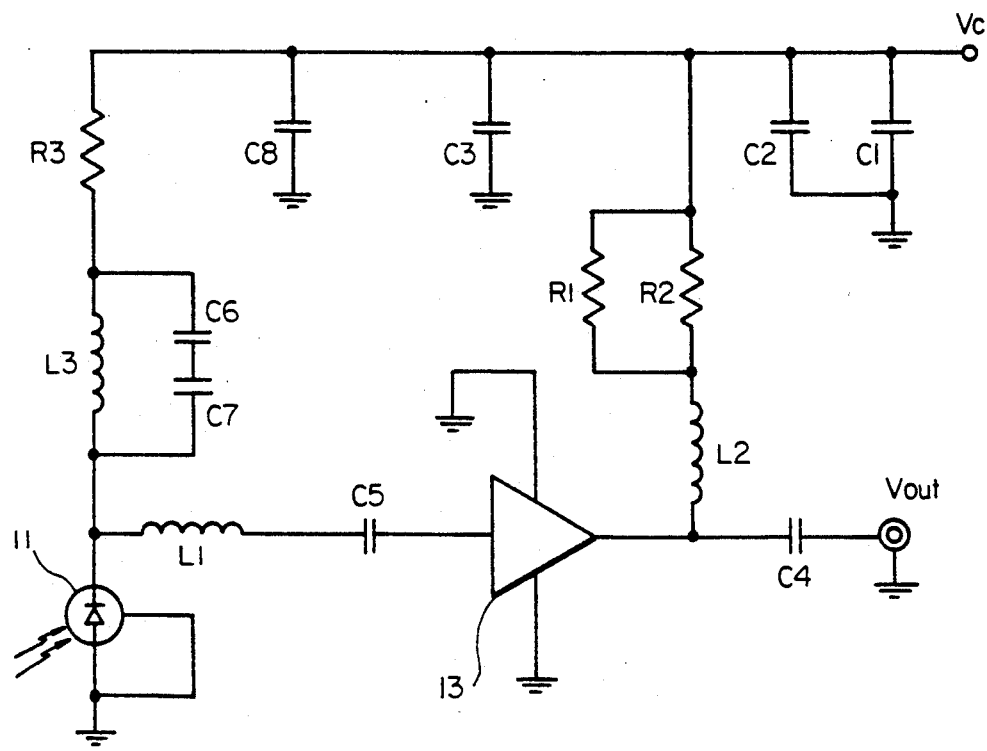
FIG_2
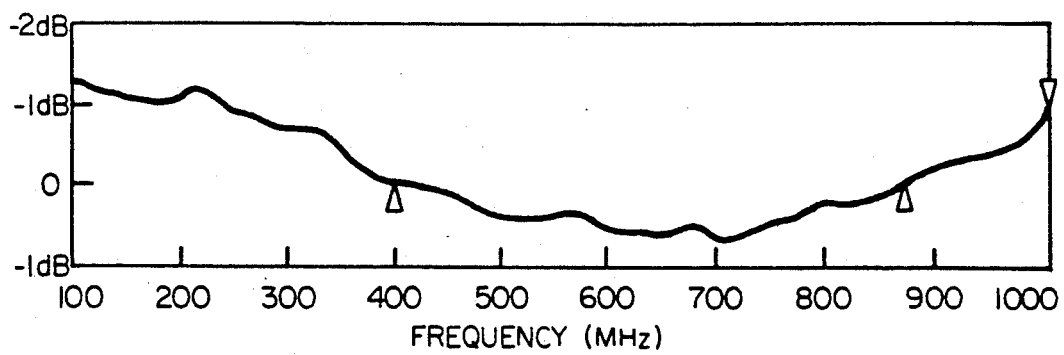
FIG_3

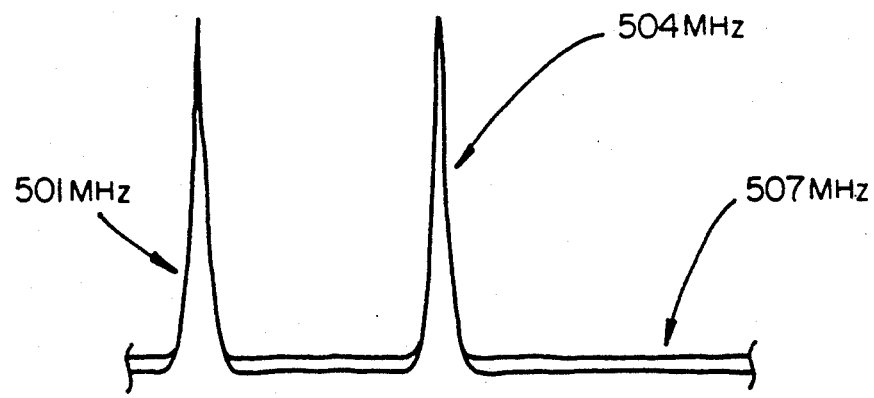
FIG_4
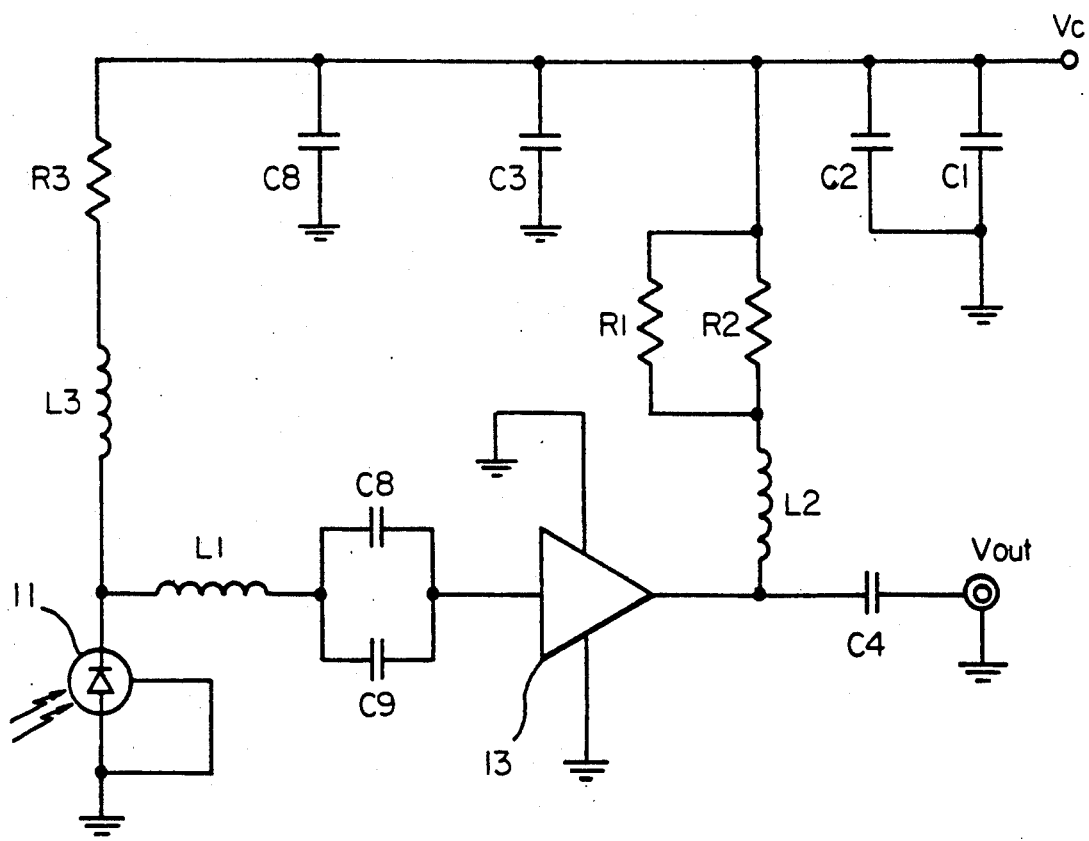
FIG_5

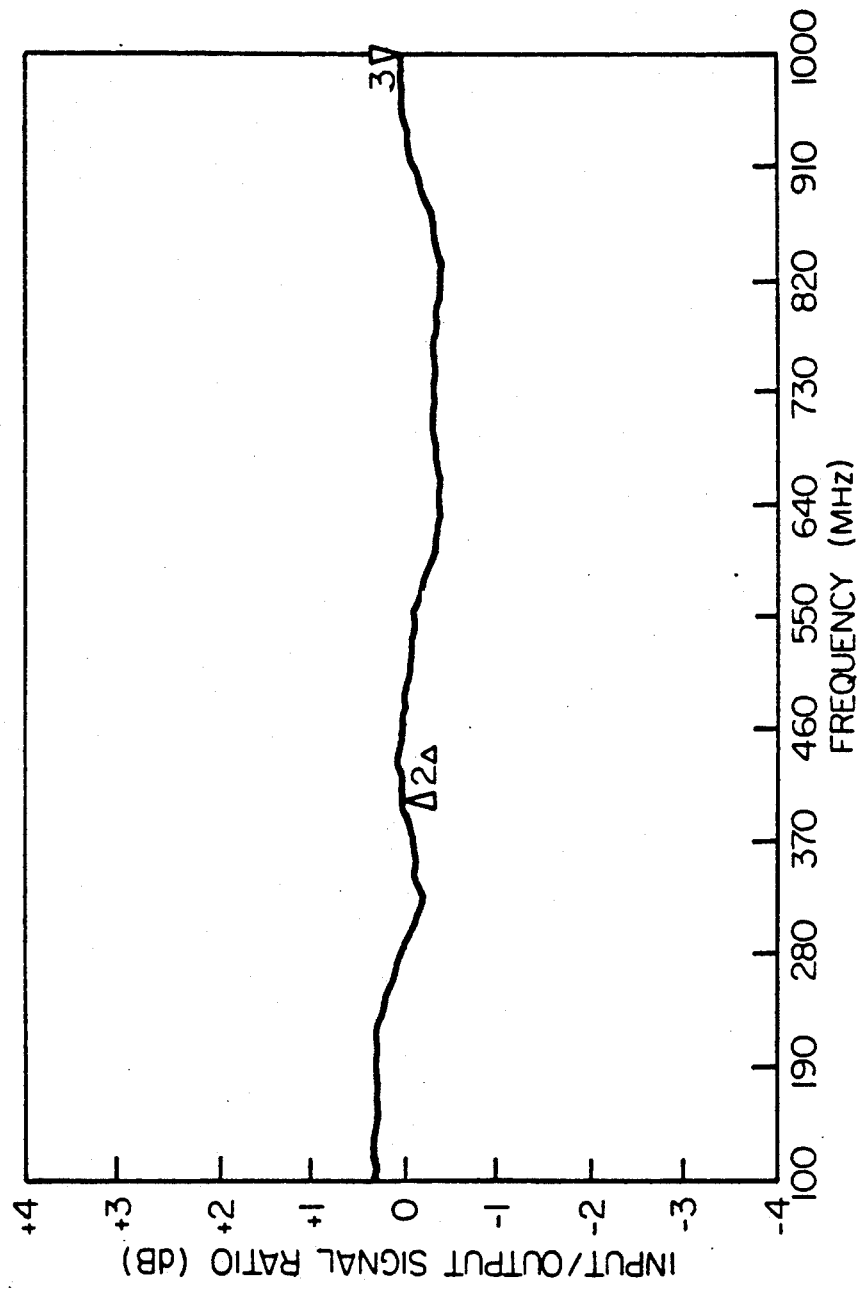
FIG_6

APPARATUS AND METHOD FOR A LINEAR, WIDEBAND SENSITIVE OPTICAL RECEIVER

FIELD OF THE INVENTION

This invention relates generally to optical receivers and, more particularly, to optical receivers suitable for amplitude modulation or frequency modulation applications.

BACKGROUND OF THE INVENTION

The modulation of optical radiation for the transmission of information has become more attractive with advances in the processing of the optical radiation. The large bandwidth potentially available in the modulation of optical radiation has been one of the factors encouraging activity in this area.

One of the components of an information system using modulated optical radiation to convey information is an optical receiver. The present invention relates to an optical receiver that can recover an amplitude modulated (AM) or frequency modulated signal from the detected optical signal. The use of the receiver to recover amplitude or frequency modulated signals at video signal frequencies, as opposed, for example, to recovery of digitally encoded signals, imposes additional requirements on the linearity of the optical receiver.

Referring to FIG. 1a, FIG. 1b, and FIG. 1c, optical receivers, illustrative of the prior art, are shown. In each case, the output signal of photodetector diode 11 is applied to a video amplifier. In FIG. 1a, light applied to the photodetector 11 causes a photoelectric current to be generated. This current is substantially converted to a voltage by resistor 14 for application to an input terminal of a video amplifier 13. In this configuration, a relatively high thermal noise results when the resistance 14 is too low, while a large value of the resistance 14 drives the amplifier 13 into saturation. When intermediate values of resistance 14 are chosen, the linearity (e.g. level of distortion) of the receiver is compromised. This compromised linearity reduces the usefulness of this optical receiver for wideband applications, e.g. AM or FM video transmission, since undue crosstalk between video channels results.

In FIG. 1b, the photo detector 11 converts the time variation of light photon flux into a time variation of electric current. The amplifier 13 and feedback impedance 15 convert the time variation electronic current into a time variation of voltage. This configuration has the same disadvantages as the configuration illustrated in FIG. 1a due to the limitations imposed by thermal noise and saturation created by use of the resistor 15.

Referring now to FIG. 1c, the output current from the photodetector 11 is applied to the input terminal of the video amplifier 13 by means of transformer 16. This configuration suffers from non-linearity of the transformer 16, a characteristic which compromises the usefulness of this receiver in amplitude modulation applications. Again, the transformer tends to convert the time variation electronic current into a time variation of voltage.

Japanese Patent No. 63-136836 discloses a plurality of resonant frequency circuit stages which are coupled between a photodetector stage and a video amplifier. These plurality of stages enhance the bandwidth. As in FIGS. 1a and 1b, a resistor 4 is used to convert a time varying current to a time varying voltage, this resistor being subject to the thermal noise/saturation tradeoff noted above.

Japanese Patent No. 54-31791 discloses a filter circuit, including a capacitor coupling the voltage signal produced by the photodetector element to the input terminal of the video amplifier, and an inductance coupled from the input terminal of the video diode to the ground terminal. Again, resistor 3 is used to substantially limit an amount of current applied to the amplifier, this circuit thus again being subject to the thermal noise/saturation tradeoff.

A need has therefore been felt for a circuit, including a photodetector device, which can respond to modulated optical transmissions and convert the optical transmissions to electrical signals so as to produce lower distortion and higher sensitivity than heretofore has been available. Such a circuit is particularly desirable for the optical transmissions which have amplitude or frequency modulation imposed thereon and the electrical signals must accurately reflect the information imposed on the optical transmissions and yet be extremely sensitive.

SUMMARY OF THE INVENTION

It is an object of the present invention to provide an improved optical receiver.

It is a feature of the present invention to provide an optical receiver suitable for detection of multiple video channels encoded using amplitude or frequency modulation and which are imposed on optical radiation.

It is another feature of the present invention to provide an optical receiver capable of detecting broadband amplitude modulated signals imposed on optical radiation, the modulation being in the range between 40 MHz to 950 MHz.

It is another feature of the present invention to provide an optical receiver capable of detecting amplitude modulated signals imposed on optical radiation, the modulation being in the range between 40 MHz and 650 MHz, more preferably between 40 MHz and 500 MHz.

It is still another feature of the present invention to provide an optical receiver having a substantially flat frequency response over the range of frequency of the amplitude modulation e.g. 400 MHz and 950 MHz, 40 MHz to 650 MHz, or 40 MHz to 500 MHz.

It is still another feature of the present invention to provide an optical receiver having substantially linearity (low distortion) over the range of frequency of the amplitude modulation so that the video signal from one channel does not affect the signal in the other channels.

It is still another feature of the present invention to provide an optical receiver having a high sensitivity (low noise) over the range of frequency of the amplitude modulation so that the video signal has better quality.

It is a still further feature of the present invention to provide an optical receiver for amplitude modulated carrier signals that can be fabricated from commercially available components.

The aforementioned and other features are attained, according to the present invention, by detecting the optical radiation with a photodetector device operable in the frequency range of modulation of the optical radiation. The photodetector device converts time varying optical flux signals into time varying electronic current signals. The electronic signals are applied through a series inductor/capacitor combination to the input terminal of a wideband video amplifier. The capacitor serves as a DC current blocking device so that the DC current does not saturate the amplifier. The series inductor transfers current from the optical detector to the amplifier and also is impedance matched with the parameters of the video amplifier, resulting in generally flat frequency response over the frequency range of interest, e.g. 400 MHz to 950 MHz, 40 MHz to 650 MHz, or 40 MHz to 500 MHz.

These and other features of the invention will be understood upon reading of the following description along with the drawings.

BRIEF DESCRIPTION OF THE DRAWINGS

FIG. 1a, FIG. 1b, and FIG. 1c are schematic diagrams of optical receivers according to the prior art.

FIG. 2 is a schematic circuit diagram for one embodiment of an optical receiver of the present invention.

FIG. 3 is a plot illustrating the flat frequency response of the receiver of FIG. 2, FIG. 3 showing the ratio of the input signal to output signal as a function of frequency.

FIG. 4 is a two tone plot of two signals for the receiver of FIG. 2, each signal having a different frequency, illustrating that the crosstalk signal is generally of the same magnitude or below the magnitude as the measurement instrument noise.

FIG. 5 is a schematic circuit diagram for another embodiment of an optic receiver of the present invention.

FIG. 6 is a plot illustrating the flat frequency response of the receiver of FIG. 5, FIG. 6 showing the ratio of the input signal-to-output-signal as a function of frequency.

DESCRIPTION OF THE PREFERRED EMBODIMENT

FIG. 2 shows one embodiment of a circuit diagram of the optical receiver according to the present invention. The power supply terminal $V_c$ is coupled through capacitance C1 and capacitance C2 to a ground terminal, through capacitor C3 and capacitor C8 to the ground terminal, through resistor R1 and R2 to a first terminal of inductor L2, and through resistor R3 to a first terminal of inductor L3 and to a first terminal of capacitor C6. A second terminal of the inductor L2 is coupled to an output terminal of amplifier 13, preferably a video amplifier, and through capacitor C4 to the optical receiver output terminal $V_{out}$. A second terminal of the inductor L3 is coupled through capacitor C7 to a second terminal of the capacitor C6, to a cathode terminal of photodetector device 11 and through inductor L1 to a first terminal of capacitor C5. A second terminal of the capacitor C5 is coupled to an input terminal of the video amplifier 13. The anode terminal of the photodetector device is coupled to the ground terminal. The inductor L3 and capacitors C6, C7 comprise a radio frequency choke.

In one preferred embodiment, the photodetector device is an Astrotec 116C light sensor module (i.e., a pigtailed InGaAs PIN detector), while the video amplifier 13 is an Avantek MSA-1120 amplifier. The inductor L1 has a value 8 nH (nanoHenrys) while the capacitor C5 has a value of 1,000 pF (picoFarads). The power supply voltage is 12 $V_{dc}$. The other components have the following values: R1=250 Ohms, R2=250 Ohms, R3=1.2 kOhms, L2=1.8 uH, L3=330 nH, C1=10 uF, C2=0.1 uF, C3=1. uF, C4=1,000 pF, C6=C7=1 pF, and C8=0.01 uF.

FIG. 3 shows a plot of the frequency response of the optical receiver of FIG. 2 over a 600 MHz range. The frequency response is ±0.5 dB for the frequency range of 400 MHz to 950 MHz.

FIG. 4 illustrates a reproduction of the results of a two tone ratio measurement for a two laser test at total optical power of 1 mW and with 50% optical modulation at each laser. The first tone has a frequency of 501 MHz, while the second tone has a frequency of 504 MHz in the arrangement in which the illustrated measurements were performed. The crosstalk signal frequency is given as $2f_1-f_2=2(504)-501=507$ MHz. As can be seen by reference to FIG. 4, the crosstalk signal in the area of the 507 MHz, if present, is generally of the magnitude of the noise. The two tone ratio can be measured by increasing the sensitivity of the measuring apparatus and is found to be 79.4 dB (79.4 dB above the carrier) or about 10 billionth of the test tone strength.

Referring once again to FIG. 2, the operation of the optical receiver can be understood as follows. The optical radiation, with the modulation imposed thereon, causes fluctuations in the current through the photodetector device 11. The capacitor C5 and the inductor L1 couple current from the detector 11 into amplifier 13 and have values that are selected to match the input impedance of the video amplifier 13. The principal function of C5 is to act as a DC blocking (i.e., DC level changing) capacitor. The output terminal of the video amplifier 13 is coupled through blocking capacitor C4 to the output terminal $V_{out}$. For the video amplifier used in the present invention, the power is supplied through the output terminal of the video amplifier. The resistors R1 and R2 determine the steady state value of current applied to the video amplifier over temperature while the (radio frequency choke) inductor L2 provides high frequency isolation between the output terminal of the video amplifier and the power supply. The capacitors C1, C2, C3, and C8 minimize the effects of fluctuations in the power supply applied to terminal $V_c$ and also provide grounding for RF leakage into the power supply and noise pick up at the wires and traces of the power supply leads. The resistor R3 limits the flow of current through the photodetector device 11. The inductance L3 minimizes the leakage of high frequency fluctuations into the power supply line while the capacitors C6 and C7 balance the frequency response of the device.

The frequency response, shown in FIG. 3, indicates that over the frequency of interest, i.e., 400 MHz through 950 MHz, the frequency response is within ±0.5 dB. The two tone ratio or crosstalk measurement is an indication of the ability of the optical receiver to separate video channels. The 79.4 dB ratio was measured at 500 MHz, 700 MHz, and 900 MHz. The average noise current was measured to be 6 $pA/Hz^{0.5}$.

FIG. 5 shows another embodiment of the invention, this figure being similar to the embodiment of FIG. 2, with like elements being similarly identified. In FIG. 5, the radio frequency choke simply comprises the inductor L3 rather than additional frequency response balancing capacitors C6, C7, and the impedance matching network comprises the inductor L1 and first and second capacitors C8, C9 arranged in parallel between an output of the inductor L1 and an input of the video amplifier 13. The preferred values of the components of FIG. 5 are identical to those of FIG. 2 except that the inductor L3 has an inductance of 333 nH and the capacitors C8, C9 have values of 1000 PF and 12 PF. FIG. 6 shows a frequency response of the receiver of FIG. 5 over a range of 100 MHz to a 1000 MHz. As this figure illustrates, the frequency response though the receiver is with ±0.4 dB over this frequency range.

According to the invention, as can be appreciated by examining FIGS. 2 and 5, an output current of the photodetector device 11 is substantially all coupled into an input of the amplifier 13, with the only exception being any current which may leak through the radio frequency choke. According to the prior art, current from the photodetector device is generally diverted through an additional path, which generally includes either a resistor or a transformer so as to result in the generated current being transformed into a time varying voltage which is inputted to the amplifier 13. Inputting in time varying voltage as taught by the prior art does not allow for minimizing distortion over a large frequency range, which is extremely important in broadband AM or FM applications, whereas according to the invention inputting the time varying current into the amplifier allows a means for improving the frequency response of the receiver.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. An optical receiver for converting optical signals into electrical signals, comprising:
    a photodetector device having a cathode and an anode and being capable of responding to optical signals so as to generate a time varying electronic current;
    an amplifier;
    a voltage source;
    a radio frequency choke having a first node coupled to the photodetector cathode and a second node coupled to the voltage source;
    means for coupling the photodetector cathode to an input of the amplifier such that except for current leakage through the radio frequency choke substantially all of the time varying electronic current generated is coupled directly into the amplifier with direct current being blocked.

2. The receiver of claim 1, the coupling means comprising an inductor and capacitor connected in series to the photodetector cathode and the amplifier input.

3. The receiver of claim 2, the values of the capacitor and the inductor being selected to provide a frequency response of ±1 dB over the frequency range of 400 MHz to 950 MHz.

4. An optical receiver for recovering a video frequency signal imposed on optical radiation, the optical receiver comprising:
    a photodetector device;
    a radio frequency choke;
    an impedance network having a first terminal coupled to the photodetector device and the radio frequency choke, the impedance network including an inductor and capacitor coupled in series; and
    a video amplifier, the video amplifier having an input terminal coupled to a second terminal of the impedance network, wherein the impedance network is implemented to provide an impedance match with the video amplifier over a selected frequency range, an output of the photodetector device having no more than two destination locations, one destination location being through the radio frequency choke, the other destination location being through the input terminal to the video amplifier.

5. The receiver of claim 1, the preselected frequency range being between 35 MHz and 500 MHz.

6. The optical receiver of claim 4, wherein the selected frequency range is 400 MHz to 950 MHz.

7. The optical receiver of claim 4, wherein the photodetector device is as InGaAs PIN detector.

* * * * *